(12) United States Patent
Daamen et al.

(10) Patent No.: US 9,546,884 B2
(45) Date of Patent: Jan. 17, 2017

(54) SENSOR

(75) Inventors: Roel Daamen, Herkenbosch (NL); Aurelie Humbert, Bruxelles (BE); Matthias Merz, Leuven (BE); Youri Victorovitch Ponomarev, Leuven (BE)

(73) Assignee: NXP B.V., Eindhoven (NL)

( * ) Notice: Subject to any disclaimer, the term of this patent is extended or adjusted under 35 U.S.C. 154(b) by 430 days.

(21) Appl. No.: 12/889,832

(22) Filed: Sep. 24, 2010

(65) Prior Publication Data

US 2011/0079649 A1  Apr. 7, 2011

(30) Foreign Application Priority Data

Sep. 25, 2009 (EP) .................... 09290734

(51) Int. Cl.
*G06K 19/06* (2006.01)
*G01D 5/14* (2006.01)

(52) U.S. Cl.
CPC ............. *G01D 5/14* (2013.01); *H01L 2224/11* (2013.01)

(58) Field of Classification Search
CPC .... G06K 7/12; G06K 19/07749; B42D 15/10; B41M 3/144
USPC ............ 235/491, 492; 257/E23.01, 782
See application file for complete search history.

(56) References Cited

U.S. PATENT DOCUMENTS

| 6,137,151 | A  | * | 10/2000 | Street ........................... 257/443 |
| 7,154,372 | B2 |   | 12/2006 | Vanha et al. |
| 7,255,001 | B1 |   | 8/2007  | Davis et al. |
| 2006/0289981 | A1 |   | 12/2006 | Nickerson et al. |
| 2008/0102096 | A1 | * | 5/2008  | Molin et al. ................. 424/422 |
| 2008/0156095 | A1 | * | 7/2008  | Tsuji et al. ................. 73/504.02 |
| 2009/0179751 | A1 |   | 7/2009  | Forster |
| 2011/0018097 | A1 |   | 1/2011  | Ponomarev et al. |

FOREIGN PATENT DOCUMENTS

| EP | 2230507 A1 | 9/2010 |
| EP | 2343541 A1 | 7/2011 |
| WO | 01/84099 | 11/2001 |
| WO | 2005/104228 A1 | 11/2005 |
| WO | 2011010264 A1 | 1/2011 |

OTHER PUBLICATIONS

European Extended Search Report for Patent Appln. No. EP09290734.4 (Apr. 22, 2010).

* cited by examiner

*Primary Examiner* — Rafferty Kelly

(57) ABSTRACT

A sensor comprising a silicon substrate having a first and a second surface, integrated circuitry provided on the first surface of the silicon substrate, and a sensor structure provided on the second surface of the silicon substrate. The sensor structure and the integrated circuitry are electrically coupled to each other.

21 Claims, 13 Drawing Sheets

SENSOR

This application claims the priority of European patent application no. 09290734.4, filed on Sep. 25, 2009, the contents of which are incorporated by reference herein.

BACKGROUND OF THE INVENTION

WO 01/84099 (Sensirion AG) discloses a sensor module and a method for the production of the same. The sensor module comprises a thermopile and an electronic evaluation unit integrated into a semiconductor substrate. As the electronic evaluation unit is located on the same substrate as the thermopile, temperature differences can thus be measured with greater accuracy and lower susceptibility to interference.

U.S. Pat. No. 7,154,372 (Sensirion AG) discloses a micromechanical flow sensor with tensile coating. The sensor, in particular a flow sensor, is integrated on a semiconductor device and comprises a measuring element on a membrane.

US 2006/0289981 (Nickerson et al) discloses packaging logic and memory integrated circuits. This document discloses that logic and memory may be packaged together in a single integrated circuit package and that the logic may be stacked on top of the memory which may be stacked on a flex substrate. Such a substrate may accommodate a multi layer interconnection system.

WO 2005/104228 describes a sensor system that includes a sensor device and an integrated circuit for driving the device. The device includes a sensor body of a silicon-based material, an upper sealing member of a silicon-based material, and a lower sealing member of a silicon-based material. The upper sealing member and the lower sealing member are joined together to cooperatively house the body therewithin in an airtight manner. The device and the circuit are formed as a stacked body.

US 2009/0179751 describes a hybrid sensor/communication device and method.

U.S. Pat. No. 7,255,001 describes a thermal fluid flow sensor.

The listing or discussion of a prior published document or any background in the specification should not necessarily be taken as an acknowledgement that the document or background is part of the state of the art or is common general knowledge.

SUMMARY OF THE INVENTION

According to an aspect of the invention, there is provided a sensor comprising:

a single silicon substrate having a first and a second surface;

integrated circuitry on the first surface of the silicon substrate;

a sensor structure on the second surface of the silicon substrate;

wherein the sensor structure and the integrated circuitry are electrically coupled to each other.

Providing the integrated circuitry and the sensor structure onto the same silicon substrate can provide advantages in terms of the power consumption and area occupied by the sensor, when compared with the prior art. Furthermore, embodiments of the invention can also reduce the costs of manufacturing and processing the sensor.

The integrated circuitry (IC) may comprise complimentary metal oxide semiconductor (CMOS) circuitry. Other types of integrated circuitry that can be provided according to embodiments of the invention include BIPOLAR and BICMOS.

The first surface and second surface of the silicon substrate may be opposing surfaces. The areas of the first and second surfaces of the silicon substrate occupied by the IC and sensor structure may be overlapping. The areas of the silicon substrate occupied by the IC and sensor structure may be coincident. This may not be possible with the prior art, whereby any sensor structures and IC that are present on the same silicon substrate are located side-by-side on the same surface of the silicon substrate.

The sensor may further comprise one or more vias extending between the first and second surfaces of the silicon substrate. The one or more vias may be configured to electrically couple the CMOS circuitry to the sensor structure. The vias may be known as through silicon vias (TSVs). Vias can be a convenient way to provide electrical communication between components located on different surfaces of a silicon substrate and may not require any further volume to be occupied when providing the electrical connection between the IC and the sensor structure.

It will be appreciated that the one or more vias may comprise holes in/through the silicon substrate, or may be provided at the periphery of the silicon substrate.

The sensor may be an environmental sensor such as a humidity, gas concentration (such as carbon dioxide, oxygen, hydrogen, ethylene, ammonia), pH level, liquid immersion, light intensity or temperature sensor, or a sensor for any other environmental condition/parameter or any combination thereof. In some examples, a sensor material may be usable that can sense more than parameter at the same time. The sensor may be considered as a micro-sensor.

The sensor structure may comprise a sensor conductor electrically coupled to the IC and/or sensor material adjacent to at least one surface of the conductor. The sensor material may be provided to act as a dielectric and enable better environmental sensing measurements to be made. The sensor material may comprise a I-8124ER polyimide as provided Asahi that can be used as part of a humidity sensor.

It will be appreciated that the sensor conductor may be a metal, a semiconductor, or any other material that can conduct electricity sufficiently well in order to perform the required functionality for the sensor structure to operate.

The IC may be for providing radio frequency identification (RFID) technology/processing. For example, the integrated circuitry may be used to store data, calculate and wirelessly transmit the data (for example data obtained from the sensor) to the outside world.

The sensor may comprise a plurality of sensor structures provided on the second surface of the silicon substrate. Further sensor structures may be able to be added to the silicon substrate without substantially increasing the size/volume of the sensor.

There may be provided an RFID tag or any integrated circuit comprising any sensor disclosed herein.

The RFID tag may be selected from the group comprising:

a bumped and sawn die;

a flip-chip strap package;

a dual in-line (DIL) package, which may have a wire bonded die inside.

A method of manufacturing a sensor of the kind described above from a single silicon substrate, can comprise comprising:

coupling integrated circuitry to a first surface of the silicon substrate;

coupling a sensor structure to a second surface of the silicon substrate; and providing an electrical connection between the sensor structure and the integrated circuitry.

It will be appreciated that the steps of the method are not necessarily executed in the order that they are listed, and that executing the steps in a different order can enable more convenient manufacture.

Providing an electrical connection between the sensor material and the integrated circuitry may comprise providing one or more vias in the silicon substrate. The vias may extend from the first surface of the silicon substrate to the second surface of the silicon substrate.

Coupling the sensor structure to the second surface of the silicon substrate comprises coupling a sensor conductor and a sensor material to the second surface of the silicon substrate.

Coupling the sensor conductor to the second surface of the silicon substrate may comprise etching one or more trenches into the silicon substrate, and providing the sensor conductor to the one or more trenches. Coupling the sensor material to the second surface of the silicon substrate may comprise etching one or more further trenches into the silicon substrate, and providing the sensor material to the one or more further trenches.

BRIEF DESCRIPTION OF THE DRAWINGS

A description is now given, by way of example only, with reference to the accompanying drawings, in which.

DETAILED DESCRIPTION

One or more embodiments described herein relate to a sensor comprising a silicon substrate having integrated circuitry (IC) such as complementary metal oxide semiconductor (CMOS) circuitry provided on a first surface of the silicon substrate, and a sensor structure provided on a second surface of the silicon substrate. Integrating the IC and the sensor structure onto the same silicon substrate can provide advantages in terms of the power consumption and area occupied by the sensor. For example, the IC and sensor structure can be provided on different surfaces of the silicon substrate so that they can effectively overlap on opposite surfaces of the substrate, and therefore the total area of a surface of the silicon substrate does not have to be large enough to accommodate both the IC and the sensor structure side by side. Furthermore, the sensor may consist of only a single silicon substrate, as opposed to stacked layers of silicon, and this can again provide advantages in terms of the physical volume that is occupied by the sensor as well as the cost of raw materials.

Figure 1:
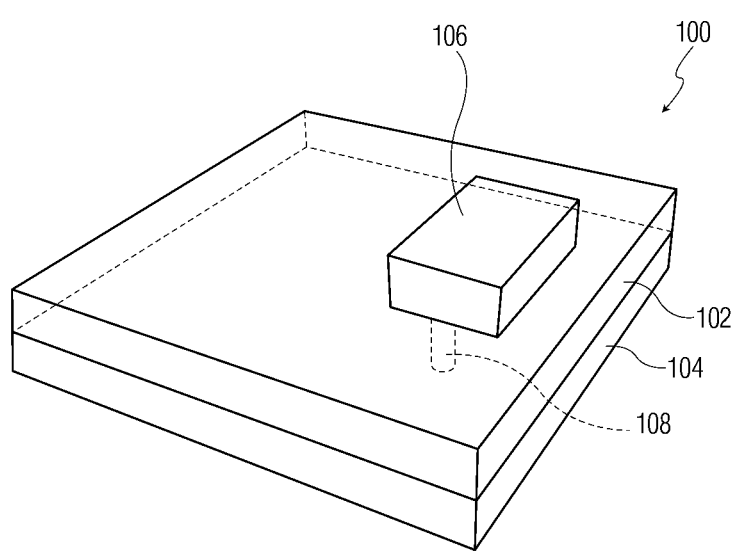
FIG. 1 shows a sensor according to an embodiment of the invention.

FIG. 1 illustrates a sensor 100 according to an embodiment of the invention. The sensor has a silicon substrate 102. Coupled to a first surface of the silicon substrate 102 is integrated circuitry, which in this example is complementary metal oxide semiconductor (CMOS) circuitry 104. As shown in FIG. 1, the CMOS circuitry 104 is coupled to a bottom surface of the silicon substrate 102.

Coupled to a second surface of the silicon substrate 102 is a sensor structure 106. As discussed in more detail below, the sensor structure may be a comb structure, or any other type of sensor, including meanders, meander-combs or any other type of meander structure.

The sensor structure 106 is in electronic communication with the CMOS circuitry 104 using a via 108 through the silicon substrate 102. As is known in the art, vias, or through silicon vias (TSVs), can be used to electrically couple components on different surfaces of a silicon substrate 102.

It will be appreciated that incorporating a sensor structure 106 onto a silicon substrate 102 in accordance with embodiments of the invention can enable further functionality to be associated with a silicon substrate 102 without requiring an increase in the size of the silicon substrate 102 and/or a device/housing containing the silicon substrate 102. For example, a radio frequency identification (RFID) integrated circuit/tag can have one or more sensors associated with its pre-existing silicon substrate without increasing the size of the silicon substrate 102, thereby avoiding an increase in the size of the integrated circuit/tag. RFID tag technology is being increasingly used for supply chain monitoring, and the integration of monitoring functions into the RFID technology, for example in order to monitor key environmental conditions such as for perishable products, can be seen as an advantage.

In such examples, the CMOS circuitry 104 can be used to store data received from the sensor structure 106, and/or perform one or more calculations on data, and/or wirelessly transmit the data obtained from sensors to a third party device.

Particular advantages associated with using an embodiment of the invention with RFID technology can relate to the speed of operation of a logistics chain. For instance, one would not need to stop a container to find out what it contains or any environmental conditions inside the container, including any parameters that are erroneous. For example, there may not be a need to attach cables etc. to the container to determine information from within the container as may be required by the prior art. Simply driving the container through a scanning portal (or any similar RFID receiver/external source) would be sufficient to determine information sensed from within the container. A portal could be (for an end user) a refrigerator communicating with the RFID tags and providing an audible/visual warning whenever something is approaching the end of its lifetime or a limit (such as too much carbon dioxide, etc) is reached.

FIGS. 2 to 7 illustrate the stages in the manufacture of a sensor according to an embodiment of the invention.

Figure 2A:
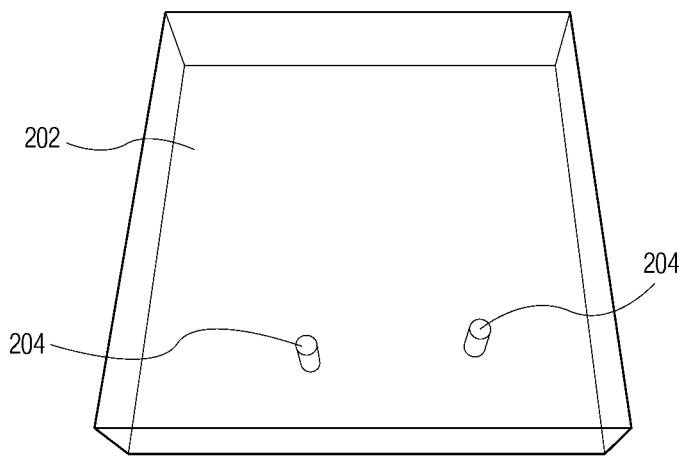
FIGS. 2 to 7 illustrate schematically a method of manufacturing a sensor according to an embodiment of the invention.
Figure 2B:
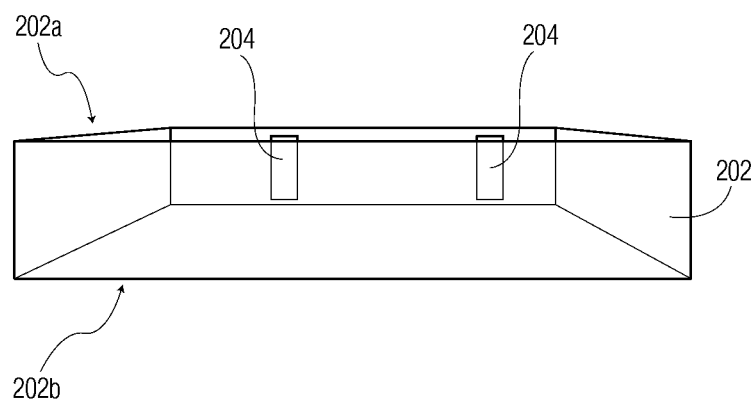

FIGS. 2a and 2b illustrate a silicon substrate/wafer 202 having two vias 204. It will be appreciated that any number of vias 204 can be provided in accordance with the requirements of the CMOS circuitry and/or sensor structure 205, 205' that will be coupled to the vias 204.

In this example, the vias 204 are exposed at a first surface 202a of the silicon substrate 202 and extend through the silicon substrate 202 towards a second surface 202b of the silicon substrate 202. The vias 204 are not exposed at the second surface 202b at this stage of manufacture and a layer of the silicon substrate 202 remains between the second surface 202b of the silicon substrate 202 and the end of the vias 204. That is, the vias 204 extend from the first surface 202a of the silicon substrate 202 towards the second surface 202b, but do not reach the second surface 202b.

Figure 3A:
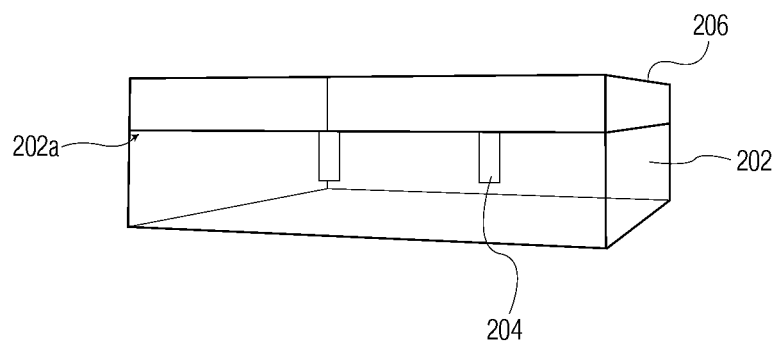
Figure 3B:
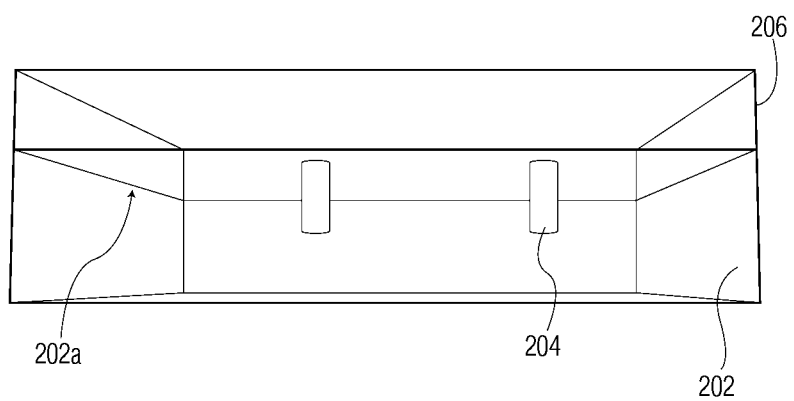

FIGS. 3a and 3b show a second stage in the manufacture of the sensor. As shown in FIGS. 3a and 3b, complementary metal oxide semiconductor (CMOS) circuitry 206 has been coupled to the first surface 202a of the silicon substrate 202. In this way, electrical connections of the CMOS circuitry 206 are arranged to coincide with the vias 204, and this may be considered as known integrated circuit (IC) processing.

Figure 4A:
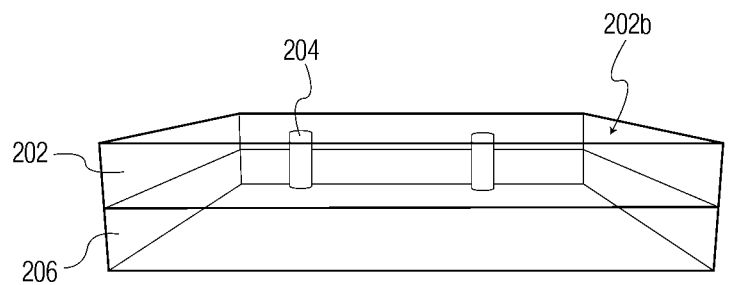
Figure 4B:
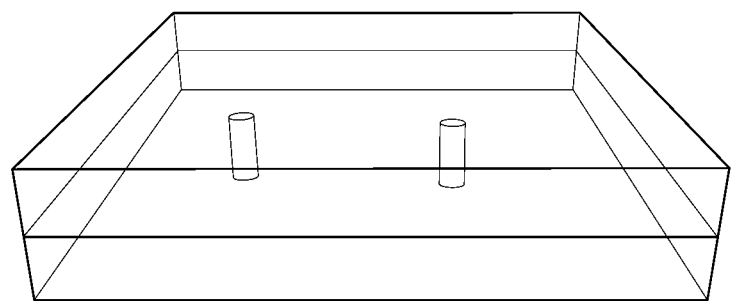

FIGS. 4a and 4b show the next stage in the manufacture of the sensor. The silicon substrate 202 and CMOS circuitry 206 are shown upside down in FIGS. 4a and 4b with the second surface 202b of the silicon substrate 202 on top.

FIGS. 4a and 4b show the silicon substrate 202 after it has been processed to expose the vias 204 on the second surface 202b of the silicon substrate 202. The silicon wafer 202 may be processed with a grinding and/or chemical mechanical planarization (CMP) operation in order to reduce the thickness of the silicon substrate 202 until the ends of the vias 204 that were previously enclosed by the silicon substrate 202 are exposed at the second surface 202b of the silicon substrate 202. That is, the silicon wafer 202 may be processed such that it is made thinner and its second surface 202b is pushed back until the vias 204 are exposed. The grinding of the silicon may be considered as a coarse processing operation, and the CMP processing may be considered as a fine processing operation. For example, CMP may be able to reduce the thickness of the silicon substrate 202 on a nanometer scale.

Figure 5:
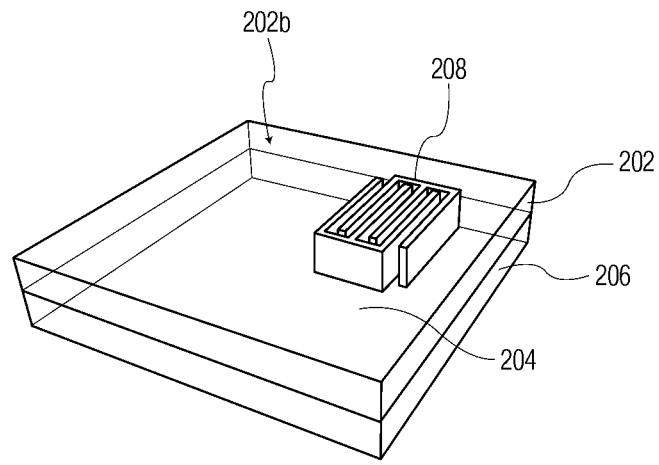

FIG. 5 shows the next stage in the manufacture of the sensor. As shown in FIG. 5, a first part 208 of a sensor structure is coupled to the second surface 202b of the silicon substrate 202. The first part 208 of the sensor structure shown in FIG. 5 consists of a double metal comb sensor structure. The metal/conductor 208 of the sensor structure may be deposited on the second surface 202b of the silicon substrate 202 and subsequently etched or otherwise processed in order to provide the desired shape. It will be appreciated that the metal structure 208 is deposited and etched so that it is in electrical communication with the other ends of the two vias 204 that are coupled to the CMOS circuitry 206 on the other side of the silicon 202.

Figure 6:
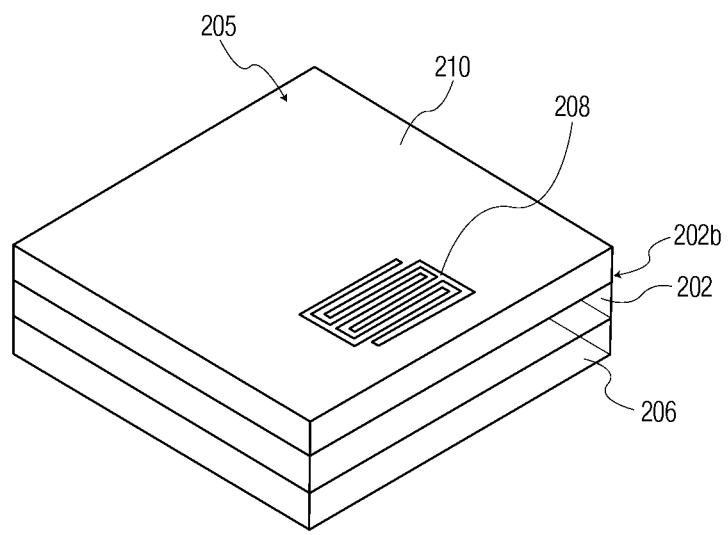

FIG. 6 shows the next stage in the manufacture of the sensor. As shown in FIG. 6, a sensor material 210 has been deposited on the second surface 202b of the silicon substrate 202 such that it surrounds the metal structure 208. In this embodiment, a top surface of the sensor material 210 is substantially aligned with a top surface of the metal structure 208. Examples of suitable sensor materials, depending upon the type of sensor, can include polyimides, porous silicates, low-dielectric constant (K) materials, teflons and/or other gas/humidity sensing materials.

The sensor material 210 may be deposited using a spin-on technique, whereby a liquid polymer is spun onto the surface 202b of the silicon substrate 202. Alternatively, the sensing material 210 may be deposited using chemical vapour deposition, or any other process.

A sensor structure 205 may be considered as the metal structure 208 in combination with the sensor material 210. All of the components/materials shown in FIG. 6 may be considered as a sensor according to an embodiment of the invention.

Figure 7:
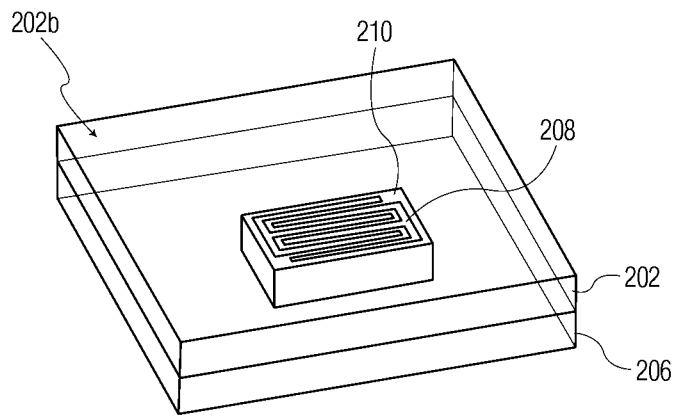

A further, optional, stage in the manufacture of the sensor is shown as FIG. 7. In FIG. 7, portions of the sensor material 210 that are not in the vicinity of the metal structure 208 have been removed. For example, any portion of the sensor material 210 that is more than a certain distance from the metal structure 208 may be removed. Removal of the sensor material 210 in this way can expose further portions of the second surface 202b of the silicon substrate 202 for receiving further sensor structures, or receiving any other suitable components. Sensors according to embodiments of the invention may have any number of sensor structures provided on a second surface 202b of a silicon substrate 202.

The sensor material 210 may be removed by lithography or etching, or any other known process.

All of the components/materials illustrated as FIG. 7 can be considered as a further embodiment of a sensor according to an embodiment of the invention.

Figure 8:
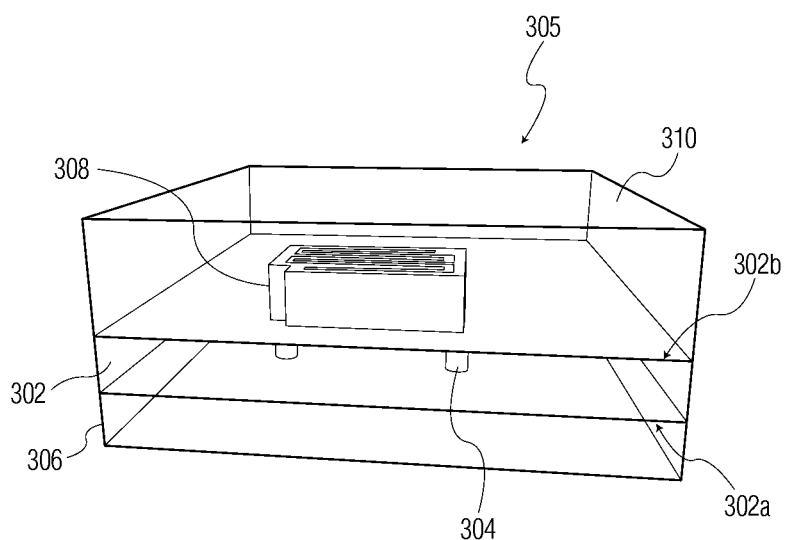
FIGS. 8 and 9 illustrate another method of manufacturing a sensor according to an embodiment of the invention.
Figure 9:
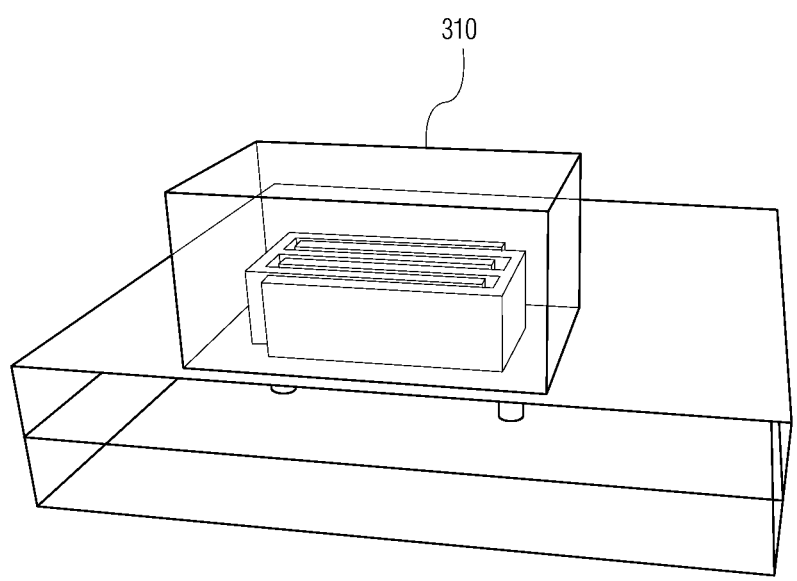

FIG. 8 and FIG. 9 shows an alternative stage in the manufacture of a sensor according to an embodiment of the invention. The stages shown as FIGS. 8 and 9 can be seen as alternatives to the stages shown as FIGS. 6 and 7 in relation to the previous embodiment.

As shown in FIG. 8, the sensor comprises a silicon substrate 302, having CMOS circuitry 306 coupled to its first surface 302a, and two vias 304 extending from the first surface 302a of the silicon substrate 302 to a second surface 302b of the silicon substrate 302. Coupled to the second surface 302b of the silicon substrate is a metal structure 308 that is similar to the metal structure 208 shown in FIGS. 5 to 7.

As shown in FIG. 8, the sensor material 310 has been deposited on the second surface 302b of the silicon substrate 302 such that it also covers a top surface 308a of the metal structure 308. Providing the sensor material 310 such that it completely encloses all of the sides of the metal structure 308 that are not adjacent to the silicon substrate 302 can provide a sensor with a different sensitivity and speed of measurement when compared with the embodiment illustrated as FIGS. 6 and 7. In this embodiment, the sensor structure 305 comprises the conductor/metal 308 along with the sensor material 310.

FIG. 9 shows an optional further stage in the processing of a sensor according to an embodiment of the invention, whereby part of the sensor material 310 shown in FIG. 8 has been removed in a similar way to that described in relation to FIG. 7.

FIGS. 10 to 13 illustrate alternative stages in the manufacture of a sensor according to an embodiment of the invention, and can be seen as alternative stages to those described and illustrated in relation to FIGS. 4 to 7 above.

Figure 10A:
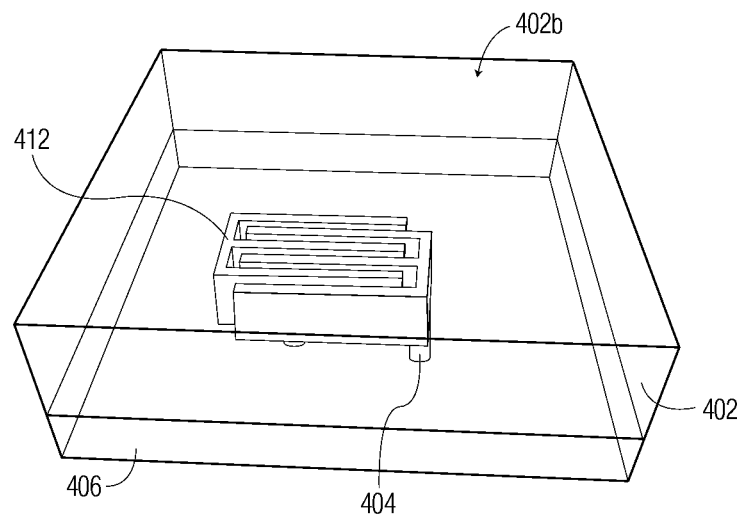
FIGS. 10 to 13 illustrate a further method of manufacturing a sensor according to an embodiment of the invention.
Figure 10B:
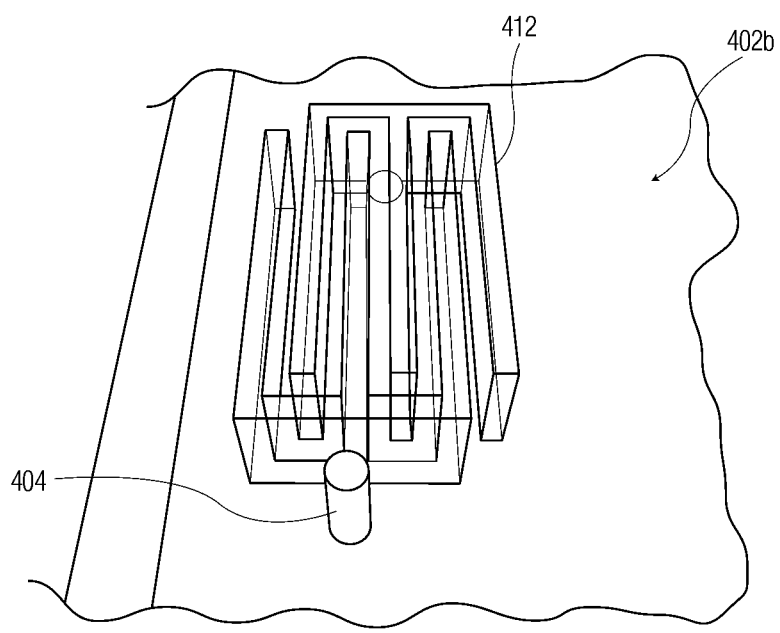

FIGS. 10a and 10b show the silicon substrate 402 and CMOS circuitry 406 that are similar to the corresponding materials shown in FIGS. 3a and 3b, turned upside down such that the second surface 402b is shown on top. The silicon substrate 402 is then etched from its second surface 402b to define two trenches 412 that correspond to a double comb sensor structure shape. The silicon substrate 402 is etched away until the vias 404 are exposed at the bottom of the trenches 412. This operation may be referred to as backside lithography.

In this example, the second surface 402b of the silicon substrate 402 can be considered as including the surfaces on the inside of the trenches 412, including the surfaces of the silicon substrate 402 at the bottom of the trenches 412.

Figure 11:
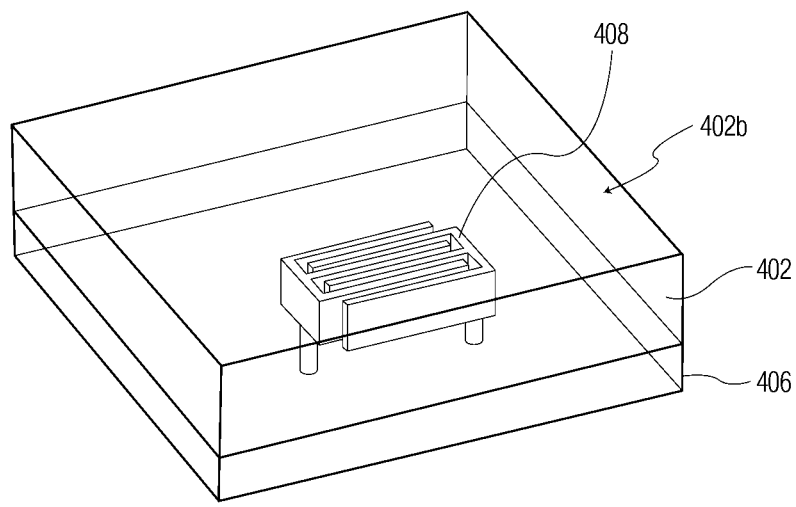

FIG. 11 shows the next stage in the manufacture of the sensor. As shown in FIG. 11, the trenches 412 that were etched and as shown in FIG. 10, have been filled with a metal or doped polysilicon material 408 such that the metal 408 takes the shape of a double comb sensor structure. Any excess metal 408 that may be left above the level of the second surface 402b of the silicon substrate 402 may be removed.

It will be appreciated that in some embodiments the sensor material 410 can be provided over the top of the metal structure 408, although doing so may reduce the sensitivity of the sensor structure because the silicon may act as a shield against the conditions that the sensor is to monitor.

As shown in FIG. 11, a metallized comb pattern is now provided in the silicon substrate 402.

Figure 12:
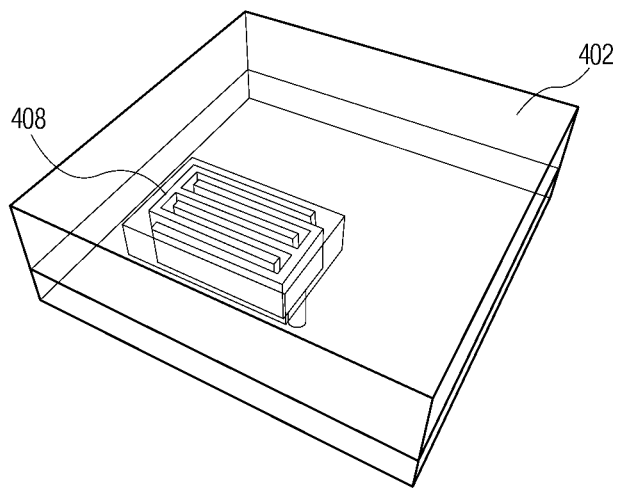

The next stage in the manufacture of the sensor is shown as FIG. 12, where the silicon substrate 402 surrounding the metal structure 408 has been etched away. The silicon substrate 402 in between the comb structure defined by the metal structure 408 is also etched away. Etching away the silicon substrate 402 in this way provides a further trench around and in between the metal structures 408.

Figure 13A:
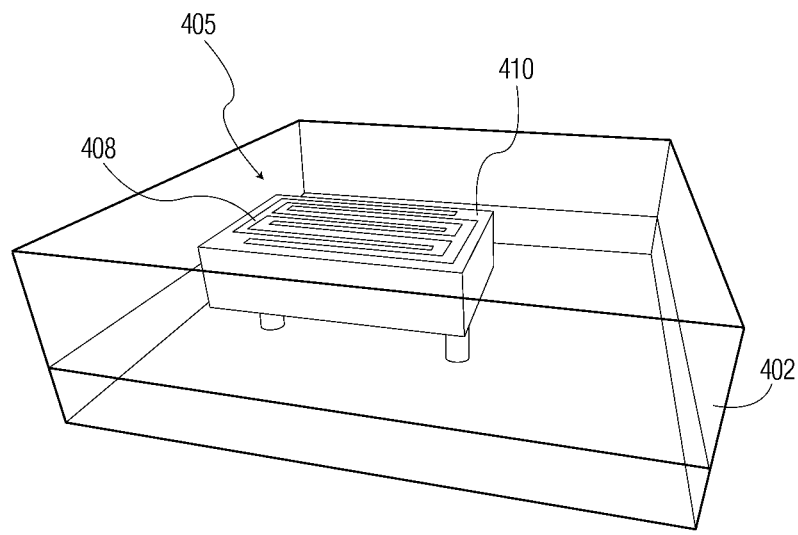
Figure 13B:
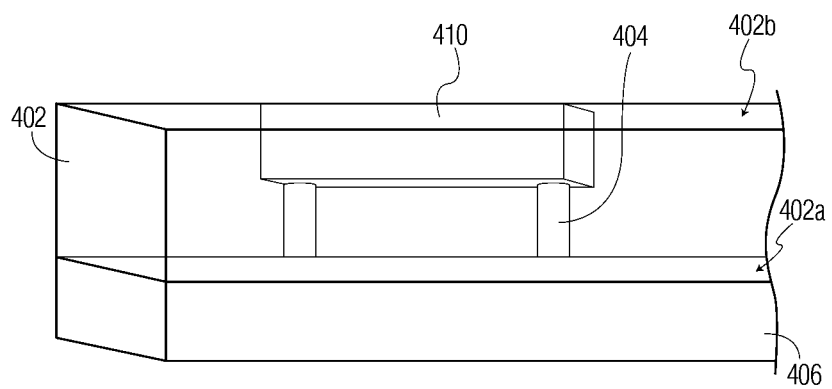

FIGS. 13a and 13b show the next stage in the manufacture of the sensor, whereby a sensor material has been provided to the further trench around the metal structure 408 such that the sensor material 410 can provide a suitable dielectric between the comb structure defined by the metal structures 408. It will be appreciated that the sensor material 410 can be similar to the sensor material 210 shown in FIGS. 6 and 7.

In this embodiment, the sensor structure 405 consists of the metal/conductor 408 and sensor material 410 embedded in the silicon substrate 402.

FIG. 13b shows the sensor in cross section, where it can be seen that the vias 404 provide an electrical connection between the CMOS circuitry 406 on the first surface 402a of the silicon substrate 402, and a sensor structure provided by the sensor material 410 and metal structure 408 on the second surface 402b of the silicon substrate 402.

Figure 14:
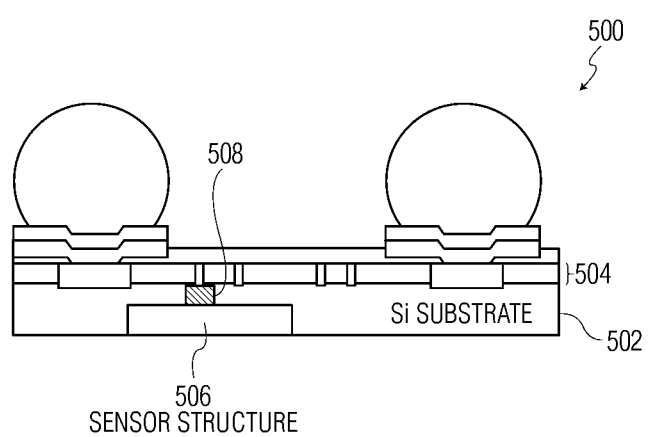
FIG. 14 illustrates schematically a sensor according to an embodiment of the invention.

FIG. 14 shows a cross-sectional view of an embodiment of a sensor 500 according to an embodiment of the invention. In this example, the sensor is embodied as bumped and sawn dies, and FIG. 14 shows the sensor 500 in cross section. The sensor 500 comprises a silicon substrate 502 having an integrated circuit (IC) 504 provided on a first surface of the silicon substrate 502 (the upper surface shown in FIG. 14). The sensor 500 also comprises a sensor structure 506 provided on a second surface of the silicon substrate 502 (the lower surface shown in FIG. 14). The IC 504 and sensor structure 506 are coupled by a through silicon via 508.

Figure 15:
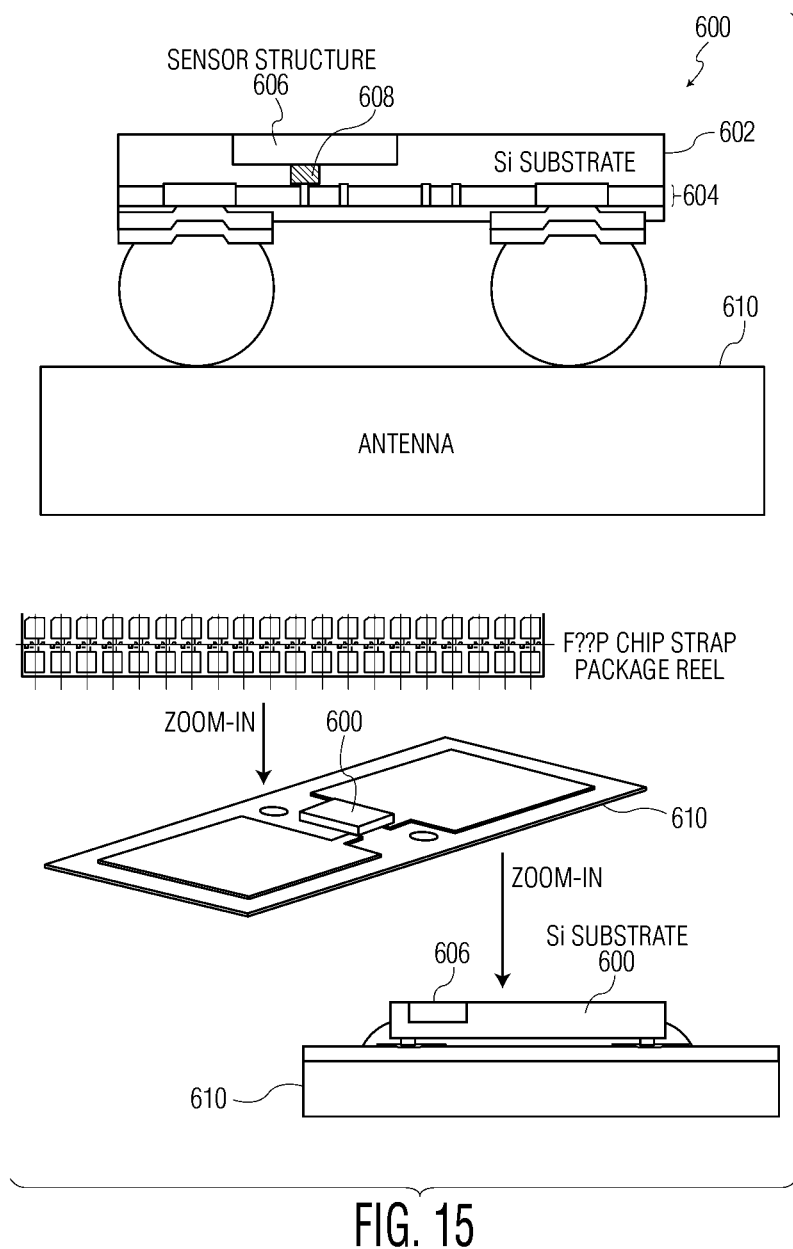
FIG. 15 illustrates a sensor according to another embodiment of the invention.

FIG. 15 shows another embodiment of a sensor according to the invention. The sensor 600 of FIG. 15 is implemented as a flip-chip strap package. The sensor 600 of FIG. 15 is similar to the sensor 500 of FIG. 14 and is "flip-chipped" onto an antenna 610. Features shown in FIG. 15 that are common to features of FIG. 14 are provided with corresponding reference number in the 600 series.

Figure 16:
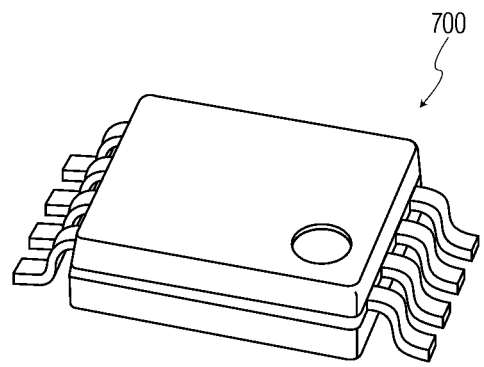
FIG. 16 illustrates a sensor according to further still embodiment of the invention.

FIG. 16 shows a further embodiment of a sensor 700 according to the invention, and in this embodiment the sensor 700 is embodied as a standard dual in-line (DIL) package with a wire bonded die inside.

One or more sensors described herein can be used for monitoring environmental conditions, such as in the vicinity of perishable products, and can be used to monitor one or more of: humidity content, gas concentrations (for example carbon dioxide, oxygen, hydrogen, ethylene, ammonia), pH, liquid emersion, light intensity, or any other environmental condition. In this way, a sensor structure can be added to silicon wafers/substrates that would be located in the vicinity of such products anyway, for example as part of RFID tags, in order to provide improved functionality.

Integrating such micro-sensors with CMOS IC technologies can decrease the cost of processing, and can provide an advantageous integrated solution in terms of area and power consumption.

Figure 17:
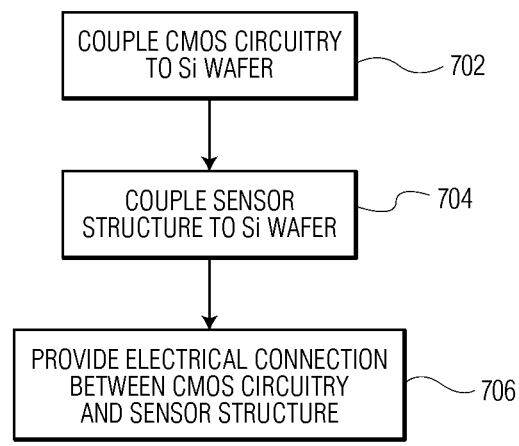
FIG. 17 illustrates schematically a method according to an embodiment of the invention.

FIG. 17 shows schematically the process flow according to a method of an embodiment of the invention. The method illustrated as FIG. 17 is a method of manufacturing a sensor from a silicon wafer, and begins at step 702 by coupling CMOS circuitry to a first surface of a silicon wafer. The CMOS circuitry may be coupled to the silicon wafer in any known way.

At step 704, a sensor structure is coupled to a second surface of the silicon wafer. Examples of how a sensor structure could be coupled to the second surface of the silicon wafer are described above in relation to FIGS. 5 to 7, 8 and 9, and 10 to 13.

An electrical connection is provided between the sensor structure and the CMOS circuitry at step 706. As discussed above, the electrical connection may be provided by a through silicon via (TSV), or may be by any other means, for example by providing one or more wires around an edge of the silicon wafer.

The invention claimed is:

1. A sensor comprising:
   a single silicon substrate having a first surface and an opposing second surface that is different than the first surface;
   integrated circuitry in the first surface of the silicon substrate; and
   a sensor structure circuit on the second surface of the silicon substrate and electrically coupled to the integrated circuitry by vias, wherein the sensor structure includes portions that are interdigitated, and the sensor structure is configured and arranged to sense environmental conditions of an atmosphere by generating an output signal in response to the atmosphere physically contacting the sensor structure.

2. The sensor of claim 1, further including dielectric sensor material on the second surface of the silicon substrate and surrounding the sensor structure and between the interdigitated portions of the sensor structure, and wherein
   the areas of the first and second surfaces of the silicon substrate occupied by the integrated circuitry and sensor structure are overlapping, and
   the sensor structure circuit, the integrated circuitry and the sensor material are configured and arranged to provide the output signal indicative of a physical reaction of the dielectric sensor material to a component in the atmosphere contacting the dielectric sensor material.

3. The sensor of claim 1, further including sensor material on portions of the second surface of the silicon substrate and surrounding the sensor structure, and wherein the vias extend between the first and second surfaces of the silicon substrate, and portions of the first surface of the silicon substrate are exposed to a surrounding environment.

4. The sensor of claim 1, further including sensor material on the second surface of the silicon substrate and surrounding the sensor structure, and wherein a top surface of the sensor material is aligned with a top surface of the sensor structure, and the sensor is for sensing environmental conditions.

5. The sensor of claim 1, wherein
   the single silicon substrate extends contiguously between the first and second surfaces and is configured and arranged to, upon exposure of the sensor structure to an atmosphere, prevent the atmosphere from contacting the integrated circuitry, and the sensor structure comprises:
a sensor conductor electrically coupled to the integrated circuitry; and
sensor material adjacent to at least one surface of the sensor conductor and configured and arranged with the integrated circuitry to respond to characteristics of the atmosphere in contact with the sensor material, and the sensor conductor is configured and arranged to output a signal based on the response of the sensor material.

6. The sensor of claim 1, wherein the first surface and second surface of the silicon substrate are opposing surfaces, the interdigitated portions form at least one of a comb structure, a double comb structure, a meandering structure, and a meander-comb structure.

7. The sensor of claim 1, comprising a plurality of sensor structures provided on the second surface of the silicon substrate.

8. A radio frequency identification tag comprising the sensor of claim 1.

9. The radio frequency identification tag of claim 8, wherein the tag is selected from the group consisting of:
a bumped and sawn die;
a flip-chip strap package; and
a dual in-line package.

10. The sensor of claim 1, wherein the sensor structure is a comb structure.

11. The sensor of claim 1, wherein the sensor structure includes a conductor and sensor material embedded in the silicon substrate.

12. The sensor of claim 1, wherein the sensor structure is configured and arranged to sense one or more of humidity content, gas concentrations, pH, liquid emersion, and light intensity.

13. The sensor of claim 1, wherein the sensor structure is configured and arranged to sense the vicinity of perishable products.

14. The sensor of claim 1, wherein the sensor structure is configured and arranged to sense at least two environmental conditions.

15. The sensor of claim 1, wherein the sensor structure includes a conductor and sensor material.

16. A sensor comprising:
a single semiconductor substrate having a first surface and an opposing second surface;
a sensor structure circuit, including interdigitated portions, configured to sense environmental conditions including components of an atmosphere that physically contact the sensor structure circuit by generating an output that varies based on the contact with the components of the atmosphere, and being arranged on or near the second surface of the semiconductor substrate; and
integrated circuitry configured to store, calculate and transmit data from the sensor structure and arranged on the first surface of the semiconductor substrate and electrically coupled to the sensor structure, wherein the integrated circuitry includes an RFID tag and terminals.

17. The sensor of claim 16, further including sensor material on the second surface of the semiconductor substrate and surrounding the sensor structure and between the interdigitated portions of the sensor structure, the sensor material between the interdigitated portions including a dielectric extending between adjacent ones of the interdigitated portions, and wherein the sensor structure is a comb structure.

18. The sensor of claim 16, further including sensor material on the second surface of the semiconductor substrate and surrounding the sensor structure, and a top surface of the sensor material is aligned with a top surface of the sensor structure, and wherein the sensor structure is configured and arranged to sense one or more of humidity content, gas concentrations, pH, liquid emersion, and light intensity.

19. The sensor of claim 16, wherein the sensor structure is configured and arranged to sense at least two environmental conditions.

20. The sensor of claim 16 further including an antenna connected to the terminals.

21. The sensor of claim 16, wherein the single semiconductor substrate extends contiguously between the first and second surfaces, and the integrated circuitry is in the first surface of the substrate and coupled to the sensor structure by electrical connectors through the substrate.

* * * * *